(12) United States Patent
Lee

(10) Patent No.: US 11,037,792 B2
(45) Date of Patent: Jun. 15, 2021

(54) SEMICONDUCTOR STRUCTURE ETCHING SOLUTION AND METHOD FOR FABRICATING A SEMICONDUCTOR STRUCTURE USING THE SAME ETCHING SOLUTION

(71) Applicant: TAIWAN SEMICONDUCTOR MANUFACTURING COMPANY LTD., Hsinchu (TW)

(72) Inventor: Chung-Chieh Lee, Taipei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/372,096

(22) Filed: Apr. 1, 2019

(65) Prior Publication Data

US 2020/0135479 A1 Apr. 30, 2020

Related U.S. Application Data

(60) Provisional application No. 62/750,522, filed on Oct. 25, 2018.

(51) Int. Cl.
*H01L 21/306* (2006.01)
*H01L 21/308* (2006.01)
*H01L 21/3063* (2006.01)

(52) U.S. Cl.
CPC ...... *H01L 21/3063* (2013.01); *H01L 21/3085* (2013.01); *H01L 21/3086* (2013.01)

(58) Field of Classification Search
None
See application file for complete search history.

(56) References Cited

U.S. PATENT DOCUMENTS

| | | | | | |
|---|---|---|---|---|---|
| 3,753,818 | A | * | 8/1973 | Poor | C23F 1/32 216/92 |
| 4,564,428 | A | * | 1/1986 | Furst | C23F 1/46 205/586 |
| 4,915,776 | A | * | 4/1990 | Lee | C23F 1/34 216/105 |
| 2007/0148978 | A1 | * | 6/2007 | Han | H01L 21/3212 438/692 |
| 2007/0281493 | A1 | | 12/2007 | Fucsko | |
| 2013/0203263 | A1 | | 8/2013 | Shimada | |
| 2013/0244443 | A1 | | 9/2013 | Mizutani | |
| 2015/0348799 | A1 | * | 12/2015 | Hong | H01L 29/66825 438/268 |

(Continued)

OTHER PUBLICATIONS

Technical Information, "Process Guidelines fo Alkaline Etching" Chemcut Coproration; Jun. 8, 2016; http://www.chemcut.net/wp-content/uploads/2015/03/alkaline_etch_process.pdf (Year: 2016).*

(Continued)

*Primary Examiner* — Shamim Ahmed
(74) *Attorney, Agent, or Firm* — WPAT, P.C., Intellectual Property Attorneys; Anthony King

(57) ABSTRACT

The present disclosure provides a semiconductor structure etching solution, including an etchant, an ionic strength enhancer having an ionic strength greater than $10^{-3}$ M in the semiconductor structure etching solution, and a solvent having a dielectric constant lower than a dielectric constant of water.

20 Claims, 18 Drawing Sheets

(56) References Cited

U.S. PATENT DOCUMENTS

| | | | | |
|---|---|---|---|---|
| 2018/0148645 A1* | 5/2018 | Lee | ................... | C09K 13/06 |
| 2018/0204947 A1* | 7/2018 | Rachmady | .......... | H01L 29/0649 |
| 2019/0103282 A1* | 4/2019 | Ge | ................... | H01L 21/02603 |
| 2019/0136132 A1* | 5/2019 | Han | ................... | H01L 27/1052 |
| 2019/0352537 A1* | 11/2019 | Ono | ................... | C09G 1/02 |

OTHER PUBLICATIONS

Atsushi Okuyama et al, "Impact of electrostatic effects on wet etching phenomenon in nanoscale region", Solid State Phenomena, vol. 219, pp. 115-118, 2015.

Xiumei Xu et al, "Capturing Wetting States in Nanopatterned Silicon", ACS Nano, 2014, 8(1), pp. 885-893.

P. Pungetmongkol, R. Hatsuki, and T. Yamamoto: "Electrical evaluation of hydrated diameter dependent thickness of electric double layer in nanochannel", The 17th International Conference on Solid-State Sensors, Actuators and Microsystems & Eurosensors XXVII, 1123-1126, 2013.

C. G. Malmberg and A. A. Maryott, "Dielectric Constant of Water from 0° C. to 1000° C.", Journal of Research of the National Bureau of Standards vol. 56, No. I, Jan. 1956.

G. Eneman et al, "Stress techniques and mobility enhancement in FinFET architectures", ECS Transactions, 50 (9) 47-58 (2012), 10.1149/05009.0047ecst ©The Electrochemical Society.

Office Action and Search Report dated Aug. 5, 2020 issued by the Taiwan Intellectual Property Office for counterpart application No. 108132642.

Brief English Translation of Foreign Office Action issued by Taiwan Intellectual Property Office.

Office Action and Search Report dated Nov. 19, 2020 issued by the Taiwan Intellectual Property Office for counterpart application No. 108132642.

English Abstract Translation of Foreign Office Action and Search Report issued by Taiwan Intellectual Property Office.

* cited by examiner

| Aspect ratio of the trench | 2 | 3 | 7 | 13 | 15 |
|---|---|---|---|---|---|
| Critical contact angle | 114° | 106° | 101° | 98° | 98° |

FIG. 3C

| Material | silicon | Silicon oxide | Silicon carbide | Titanium nitride | Silicon nitride |
|---|---|---|---|---|---|
| Contact angle | 74° | 52° | 42° | 30° | 50° |

FIG. 3D

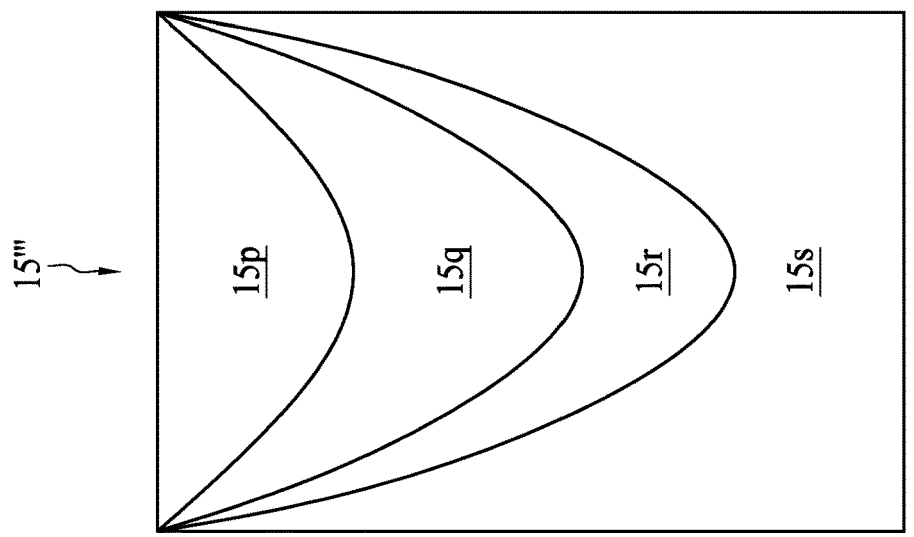
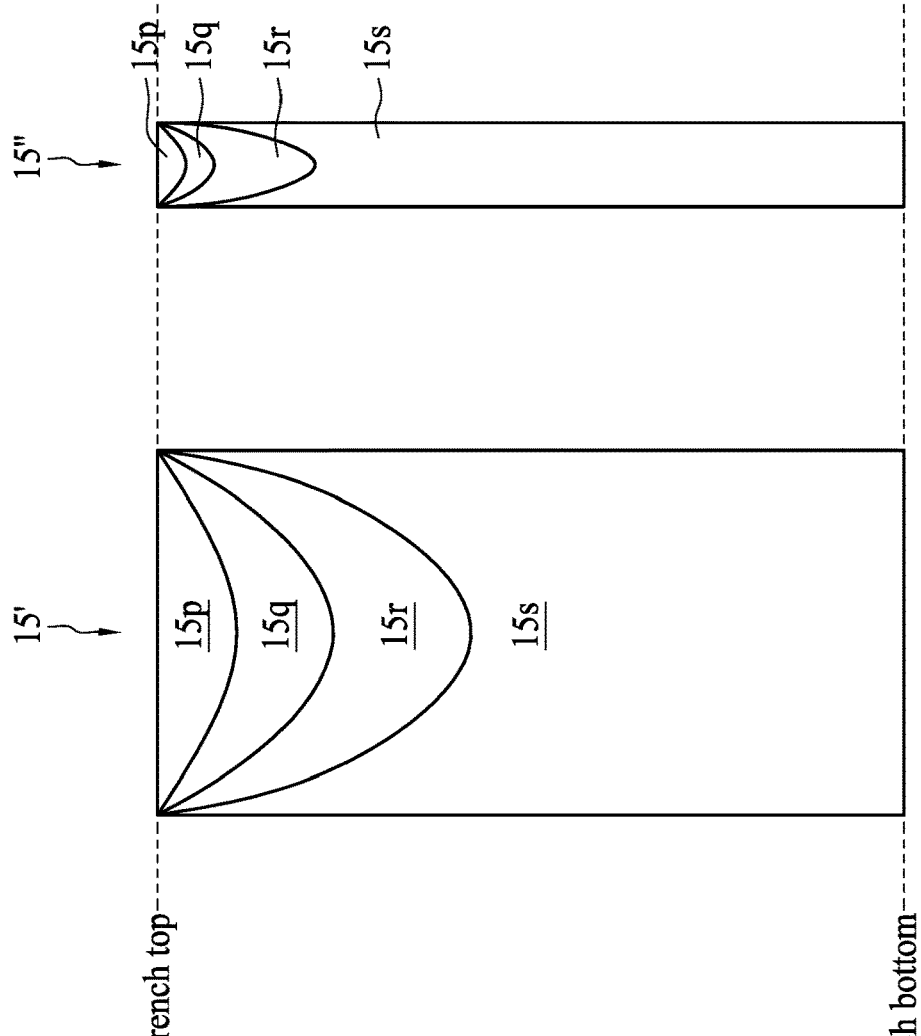

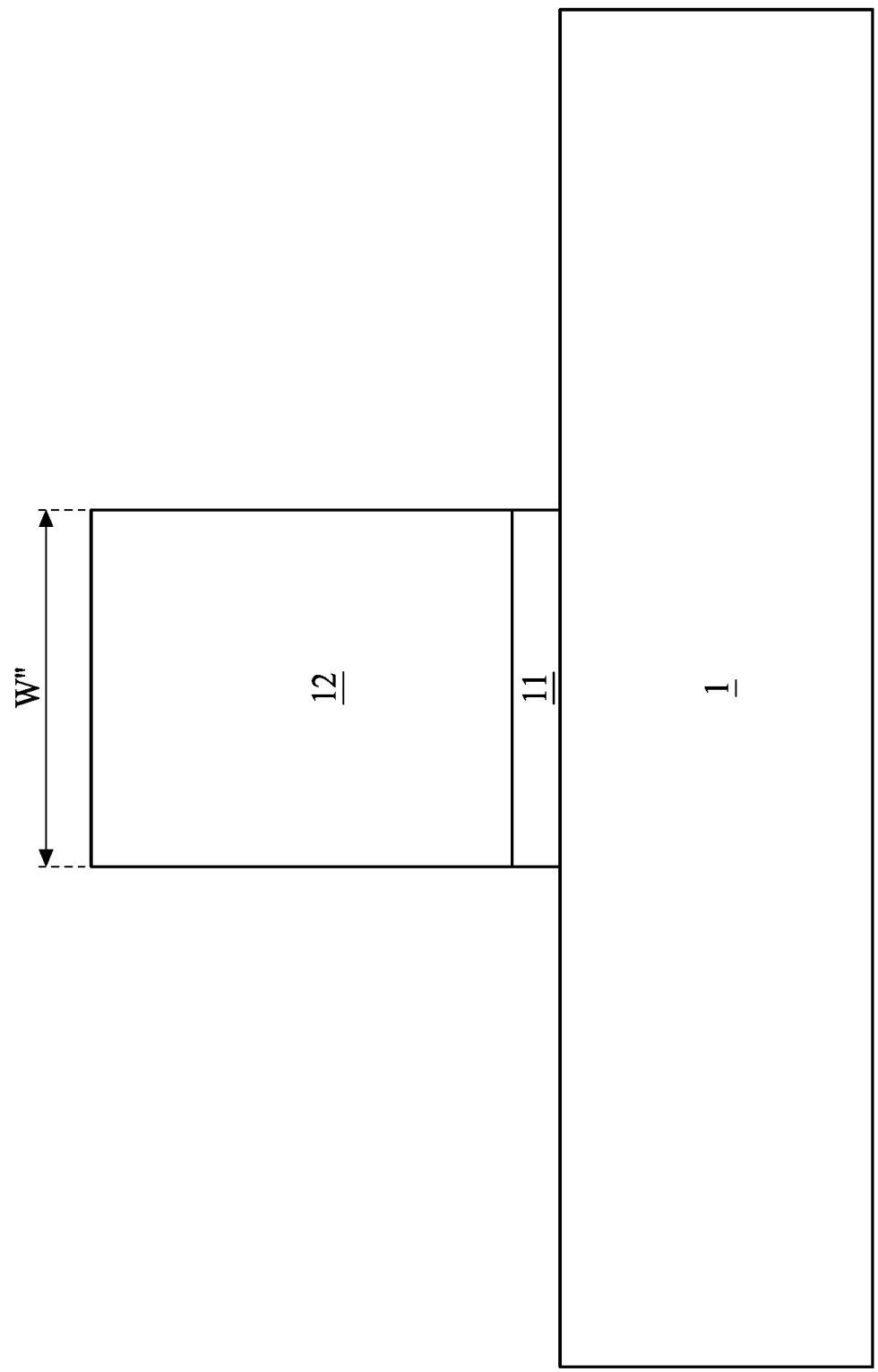

SEMICONDUCTOR STRUCTURE ETCHING SOLUTION AND METHOD FOR
FABRICATING A SEMICONDUCTOR
STRUCTURE USING THE SAME ETCHING
SOLUTION

CROSS REFERENCE TO RELATED APPLICATIONS

This application claims the benefit of prior-filed provisional application No. 62/750,522, filed Oct. 25, 2018, which is incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency. However, such scaling down process has also increased the complexity of processing and fabricating ICs. For these advances to be realized, improvements in IC processing and manufacturing are entailed.

Etching operation is a technique for removing a portion from a film, a trench, a surface, or a layer. However, etching operations may face challenges with regard to progressively smaller dimension.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3C is a lookup table illustrating a relationship between an aspect ratio of a trench and a critical contact angle of water thereon, in accordance with some comparative embodiments of the present disclosure.

FIG. 3D is a lookup table illustrating a contact angle between water and various surfaces with different materials, in accordance with some comparative embodiments of the present disclosure.

FIG. 5A is an iso-proton concentration diagram showing a simulation result of a concentration distribution of proton in a trench, in accordance with some embodiments of the present disclosure.

FIG. 5B is an iso-proton concentration diagram showing a simulation result of a concentration distribution of proton in a trench, in accordance with some embodiments of the present disclosure.

FIG. 5C is an iso-proton concentration diagram showing a simulation result of a concentration distribution of proton in a trench, in accordance with some embodiments of the present disclosure.

FIG. 10B to FIG. 10D are cross sections of a semiconductor structure during intermediate stages of manufacturing operations, in accordance with some embodiments of the present disclosure.

DETAILED DESCRIPTION

Figure 1A:
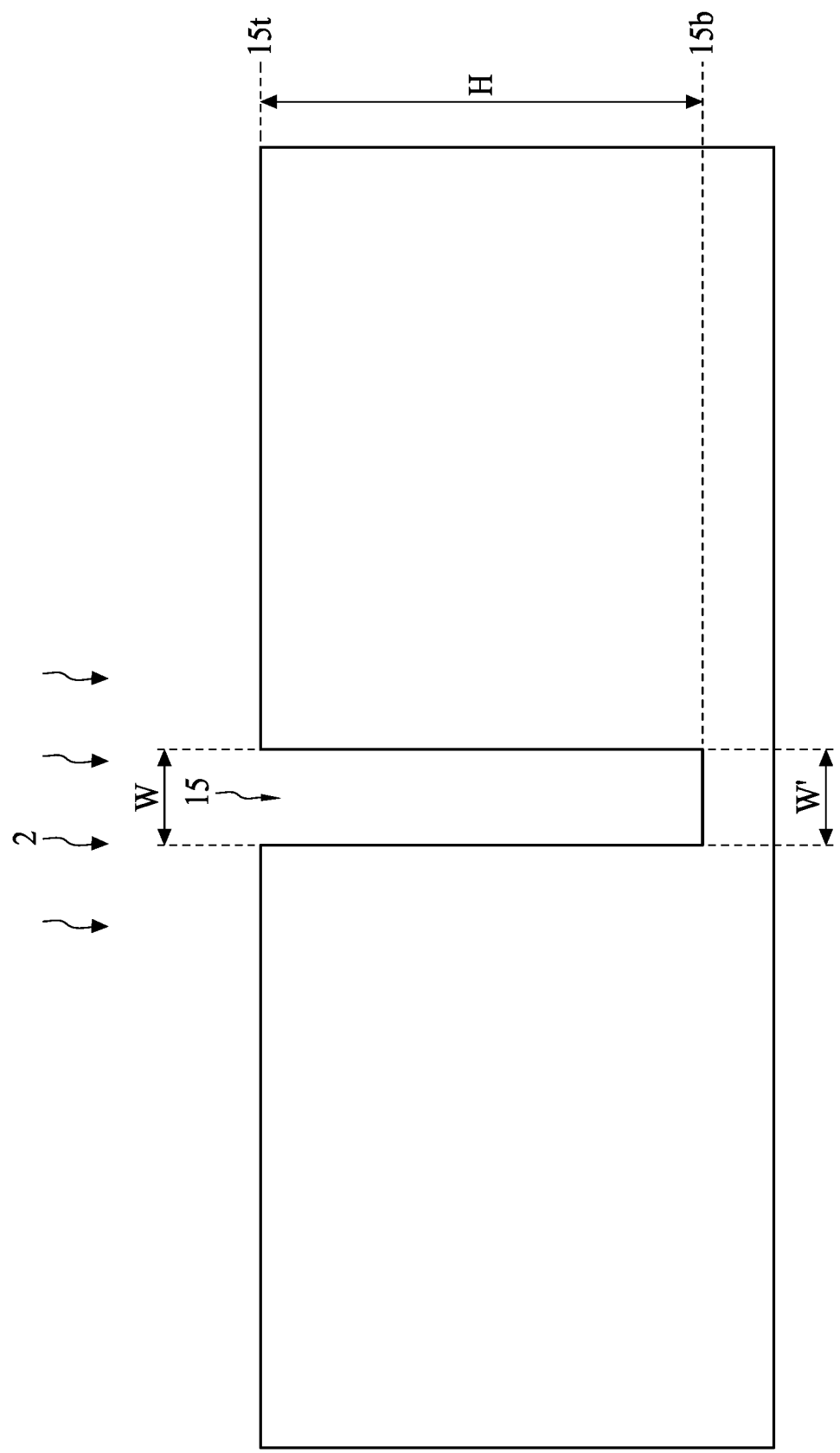
FIG. 1A is an illustration of formation of a trench in a semiconductor substrate during an etching operation.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately," or "about" generally means within a value or range which can be contemplated by people having ordinary skill in the art. Alternatively, the terms "substantially," "approximately," or "about" means within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately," or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Figure 1B:
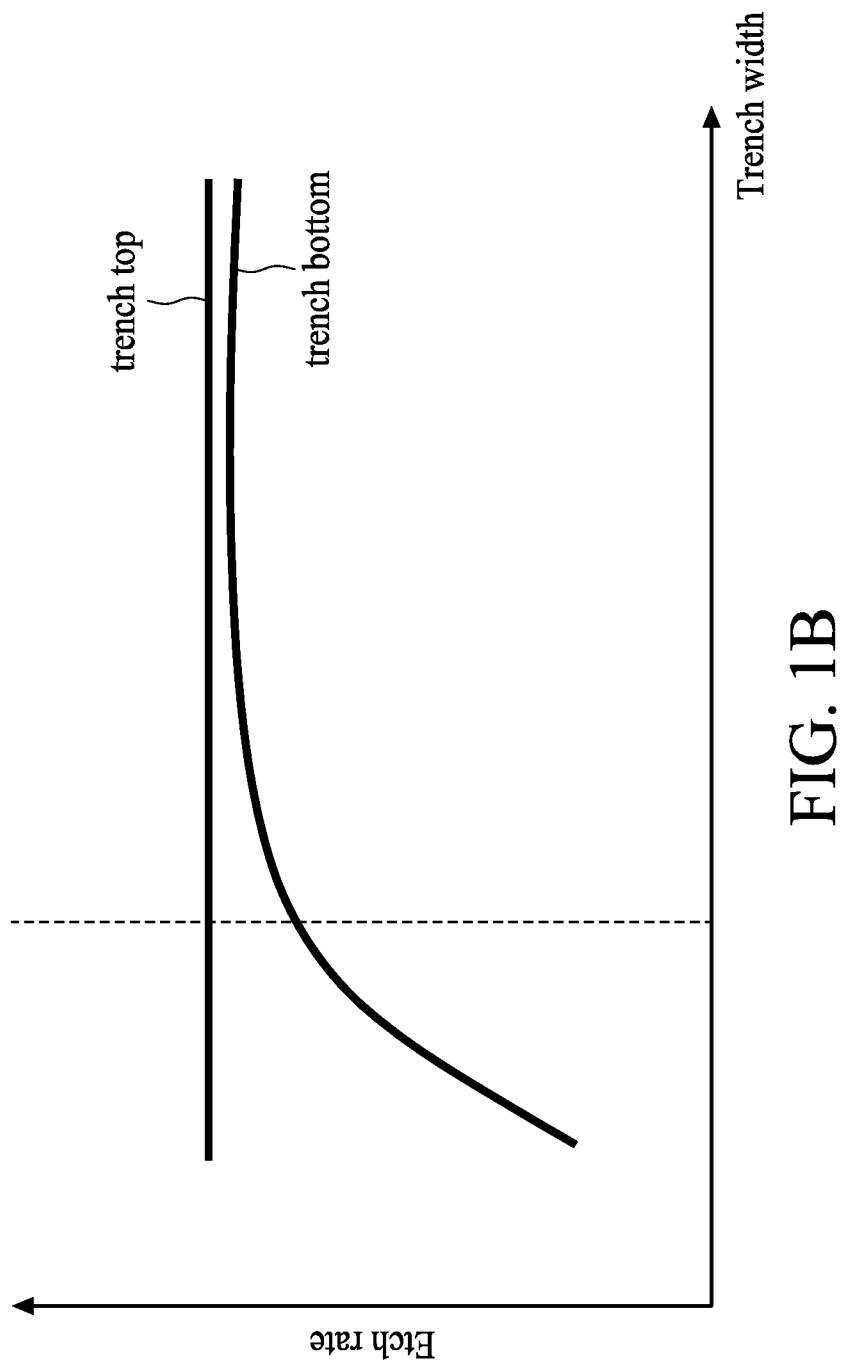
FIG. 1B is a diagram showing a relationship between a trench width and an etch rate at the trench top and at the trench bottom under an etching operation, in accordance with some comparative embodiments of the present disclosure.

Referring to FIG. 1A and FIG. 1B, FIG. 1A is an illustration of formation of a trench in a semiconductor substrate during an etching operation, FIG. 1B is a diagram showing a relationship between a trench width and an etch rate at the trench top and at the trench bottom under an etching operation, in accordance with some comparative embodiments of the present disclosure. A trench 15 is formed by applying an etching solution 2 during a wet etch operation with appropriate masking structures, wherein the position of an opening of a trench 15 is referred to as a trench top 15$t$, and an end opposite to the trench top 15$t$ of the trench 15 is referred to as a trench bottom 15$b$. In some embodiments, after the etching operation, a width W at the trench top 15$t$ and a width W' at the trench bottom 15$b$ may be different due to different accessibilities with respect to etching solution 2.

The dimension of the trench 15 may be one of the factor affecting the outcome of wet etch, by virtue of whether the etching solution 2 applied thereon can be transported to the trench bottom 15$b$. In some embodiments, when the width W is less than 20 nm, the etch rate at the trench bottom 15$b$ may be significantly reduced, which may stem from the etching solution not being able to be transported to the trench bottom 15$b$. In some other embodiments, similar issues can be induced when an aspect ratio of the trench 15 (i.e. a height H of the trench 15 divided by an average width (W+W')/2 of the trench 15) is greater than 2. Such phenomena is illustrated in FIG. 1B, wherein the x-axis of the diagram represents trench width, and y-axis represents etch rate.

Figure 2A:
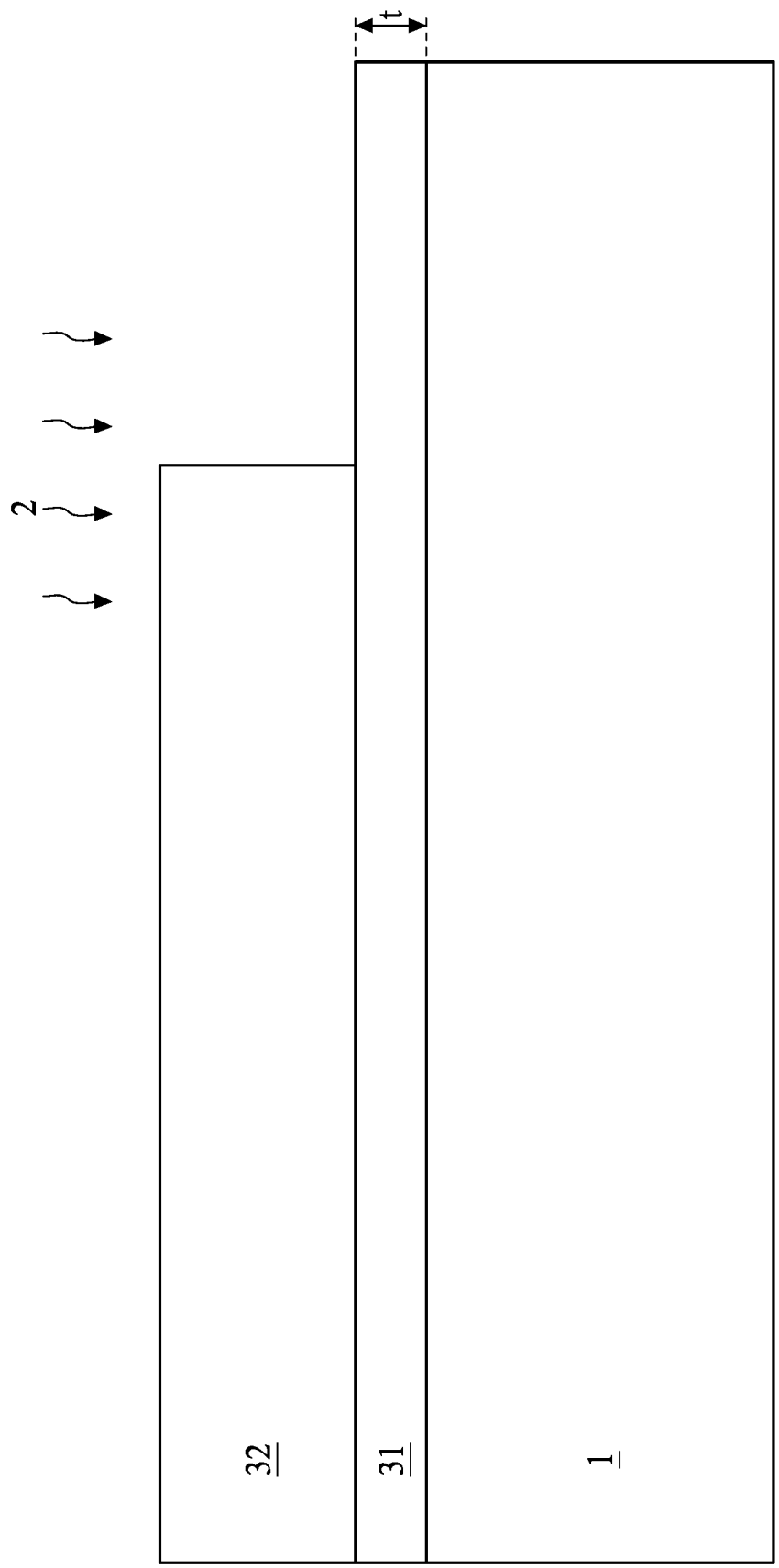
FIG. 2A to FIG. 2B are cross sections of a semiconductor structure during intermediate stages of manufacturing operations, in accordance with some comparative embodiments of the present disclosure.
Figure 2B:
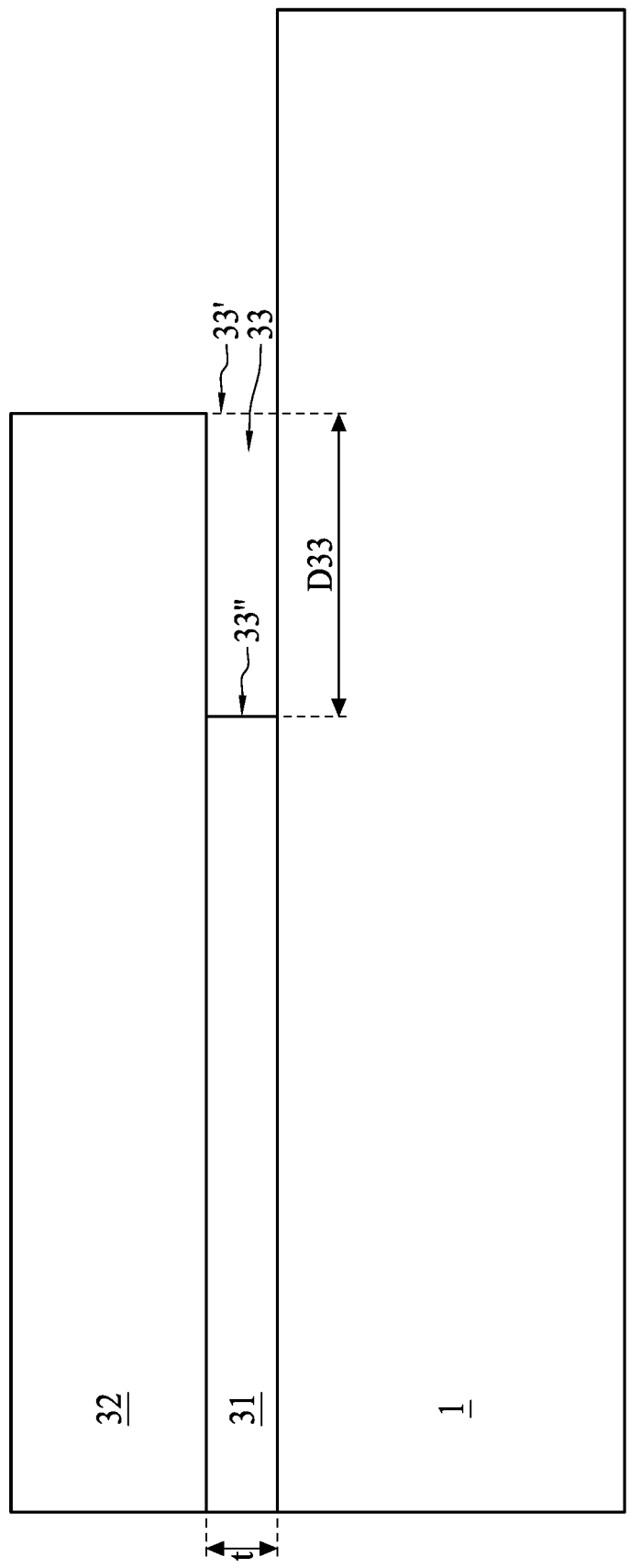
Figure 2C:
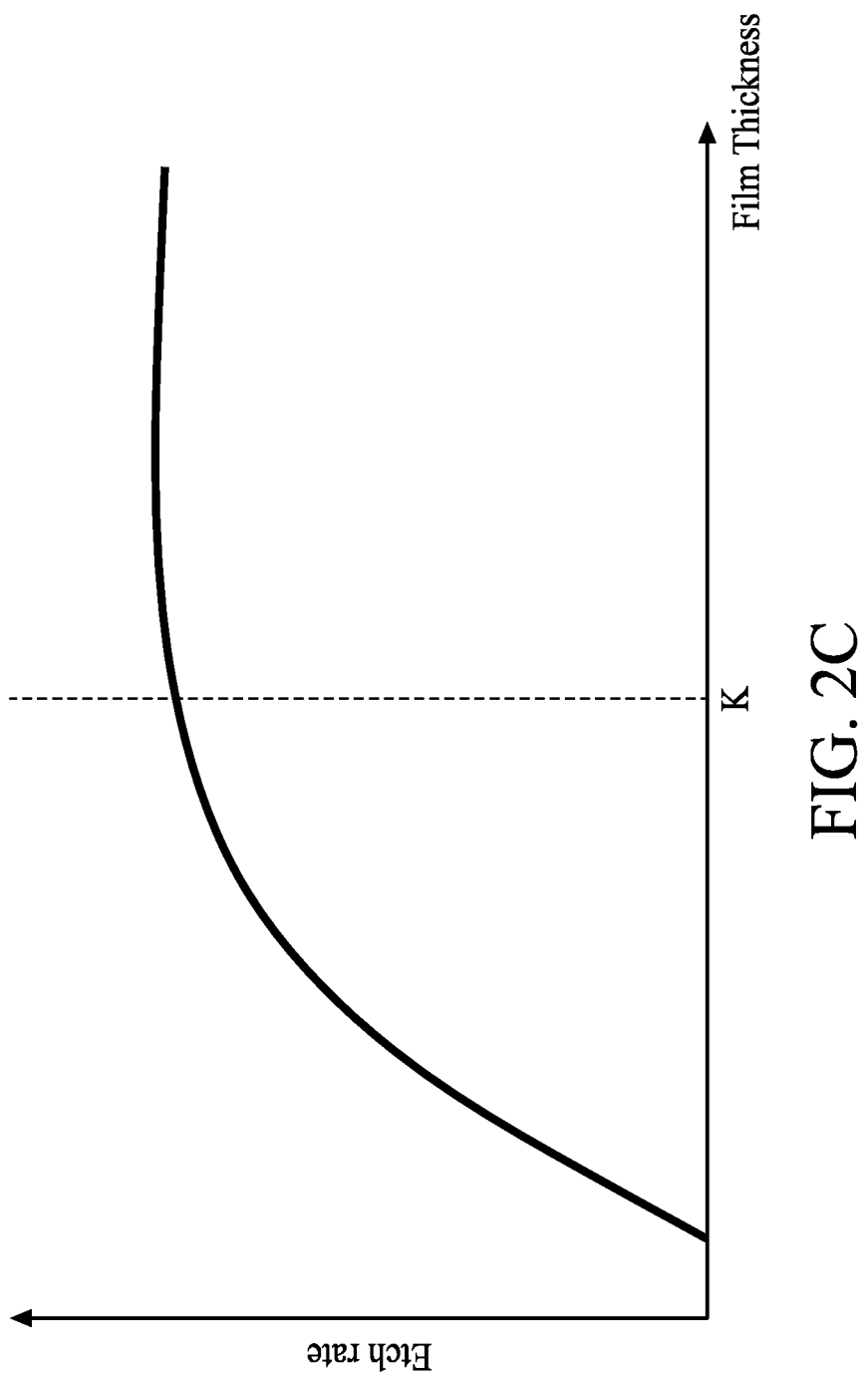
FIG. 2C is a diagram showing a relationship between a film thickness and an etch rate of the film under an etching operation, in accordance with some comparative embodiments of the present disclosure.

Similar issues may also be observed in an operation of etching in a lateral direction. Referring to FIG. 2A to FIG. 2C, FIG. 2A to FIG. 2B are cross sections of a semiconductor structure during intermediate stages of manufacturing operations, and FIG. 2C is a diagram showing a relationship between a film thickness and an etch rate of the film under an etching operation, in accordance with some comparative embodiments of the present disclosure. For example, an oxide film 31 is formed between the substrate 1 and a polysilicon layer 32. In some embodiments, an etch rate on the oxide film 31 is greater than an etch rate on the polysilicon layer 32 in a given selective wet etch operation. In some embodiments, the oxide film 31 may include silicon dioxide ($SiO_2$). A portion of the oxide film 31 is etched and a trench 33 with an opening 33' is thereby formed. However, if a thickness t of the film 31 is thinner than a threshold value, for example about 20 nm, an etch rate at a distal end 33" opposite to the opening 33' of the trench 33 is substantially lowered, rendering the oxide film 31 not being able to be removed to a desired extent under preset conditions. The decrease of the etch rate may stem from the etching solution not being able to be transported to the distal end 33" of the trench 33. As a result, a distance D33 between the distal end 33' and the opening 33' may not reach a predetermined value under such wet etch operation, thus deteriorating the performance of devices.

A trench formed in a different direction, such as etching a lateral trench on the film 33 in FIG. 2A to FIG. 2B may face similar issue as mentioned in FIG. 1. For the purpose of conciseness, hereinafter the opening 33 can be referred to as the trench top 15$t$ of the trench 15 while the distal end 33 can be referred to as the trench bottom 15$b$ of the trench 15. Such phenomena is illustrated in FIG. 2C, wherein the x-axis of the diagram represents film thickness, and y-axis represents etch rate. When the film thickness is less than a critical value K, the etch rate starting to decrease given the identical etchant and etching conditions.

Figure 3B:
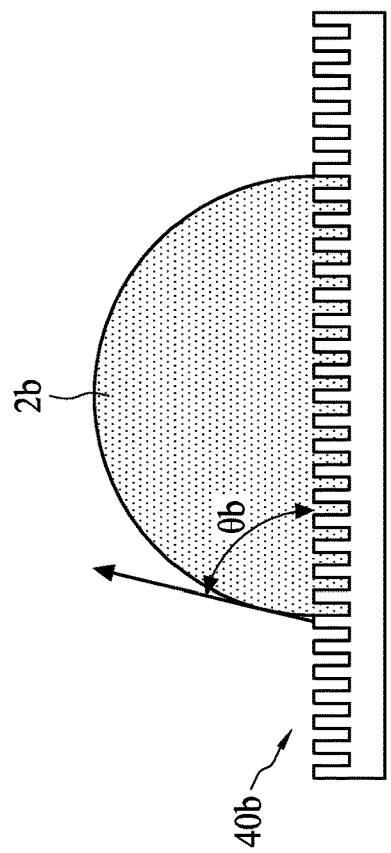
FIG. 3B is a schematic diagram showing a Wenzel model of wetting behavior of a liquid material on a second surface, in accordance with some comparative embodiments of the present disclosure.
Figure 3A:
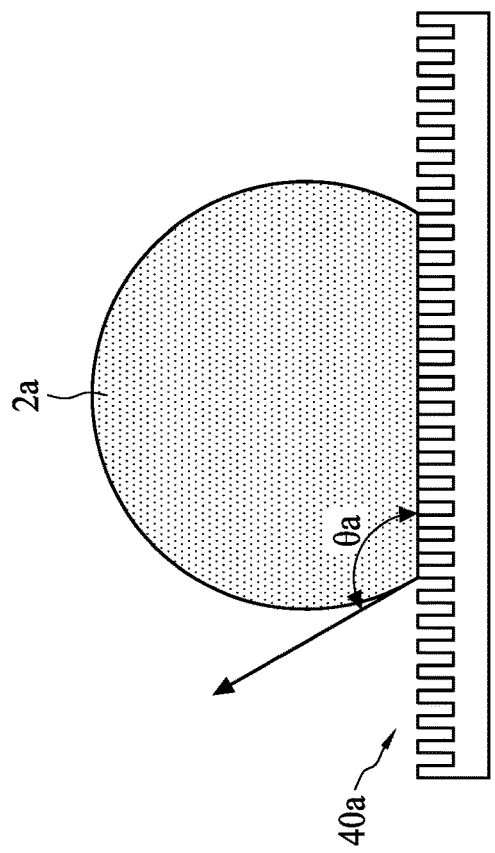
FIG. 3A is a schematic diagram showing a Cassie-Baxter model of wetting behavior of a liquid material on a first surface, in accordance with some comparative embodiments of the present disclosure.

In order to improve the performance of a wet etch operation, pinpointing factors causing the etching solution 2 not being able to be transported to the trench bottom 15$b$ is discovered in present disclosure. Referring to FIG. 3A and FIG. 3B, FIG. 3A is a schematic diagram showing a Cassie-Baxter model of wetting behavior of a liquid material on a first surface, and FIG. 3B is a schematic diagram showing a Wenzel model of wetting behavior of a liquid material on a second surface, in accordance with some embodiments of the present disclosure. Wettability in terms of the wetting behavior of liquid material on a roughened surface can be described by Cassie-Baxter model (shown in FIG. 3A) and Wenzel model (shown in FIG. 3B), wherein in the Cassie-Baxter state, a contact angle θa between a liquid material 2$a$ and a roughened surface 40$a$ is an obtuse angle, and in the Wenzel state, a contact angle θb between a liquid material 2$b$ and a roughened surface 40$b$ is an acute angle. A liquid-surface interaction in the Cassie-Baxter state is weaker than a liquid-liquid interaction, while a liquid-surface interaction in the Wenzel state is stronger than a liquid-liquid interaction. It can be observed that the wettability of the liquid material 2a on the roughened surface 40a is lower than the wettability of the liquid material 2b on the roughened surface 40b, wherein higher surface tension of the liquid material 2a in the Cassie-Baxter state may create an energy barrier by virtue of transporting the liquid material 2a through a nanoscale trench or a nanoscale roughened surface. Meanwhile in Wenzel state a nanoscale trench or a nanoscale roughened surface may be wetted by the liquid material 2b. A liquid material and a roughened surface to be in Cassie-Baxter state or Wenzel state is dictated by the surface tension between the liquid material and the surface, as well as the degree of roughness at the surface.

One hypothesis is that wetting behavior of a liquid material on a surface may be a main factor contributing to the issue addressed in FIG. 1A and FIG. 1B, that is, the etching solution not being able to be transported to the trench bottom 15b of the trench 15 may due to low wettability (i.e. in Cassie-Baxter state) between the etching solution 2 and a contacted surface thereof. The factor of wetting behavior is examined herein by experimental result to verify whether wettability is one of the root causes.

Referring to FIG. 3C and FIG. 3D, FIG. 3C is a lookup table illustrating a relationship between an aspect ratio of a trench and a critical contact angle of water thereon, FIG. 3D is a lookup table illustrating a contact angle between water and various surfaces with different materials, in accordance with some comparative embodiments of the present disclosure. A critical contact angle indicates a lowest contact angle between the liquid material and a contacted surface thereof that allows the liquid material to transport into a trench or a nanoscale roughened surface, which may also be deemed as a critical state between the Cassie-Baxter state and the Wenzel state. Each critical contact angle of water on trenches with different aspect ratios is presented in the table of FIG. 3C. It can be observed that under the condition of the same liquid material and surface material, critical contact angle of said liquid material decreases when an aspect ratio of the trenches on the surface increases. In other words, liquid material is easier to be transported into trenches with high aspect ratio than the low aspect ratio counterpart. In advanced semiconductor manufacturing operation, nanoscale trenches often possess high aspect ratio.

FIG. 3D demonstrates contact angles between water and surfaces of various materials (e.g., silicon, silicon oxide, silicon carbide, titanium nitride, and silicon nitride, etc.) utilized in semiconductor fabrication, specifically in fabricating trenches, fins, nanopillars, sidewall spacer, etch stop layer, or spacing layer, are mostly lower than 90 degree. Furthermore, the etching solution 2 includes organic solvent having a lower surface tension, thus a lower critical contact angle, than that of water on a same surface. Drawing a conclusion from FIG. 3C and FIG. 3D, the etching solution 2 may be easily transported to a trench bottom of a trench with aspect ratio equal to or more than 15 if the wetting behavior is a main factor contributing to the issue. Thereby it may be reasonable to rule off that the issue of the etching solution 2 not being able to be transported to the trench bottom 15b of the nanoscale trench 15 is stemmed from liquid wetting properties.

Figure 4B:
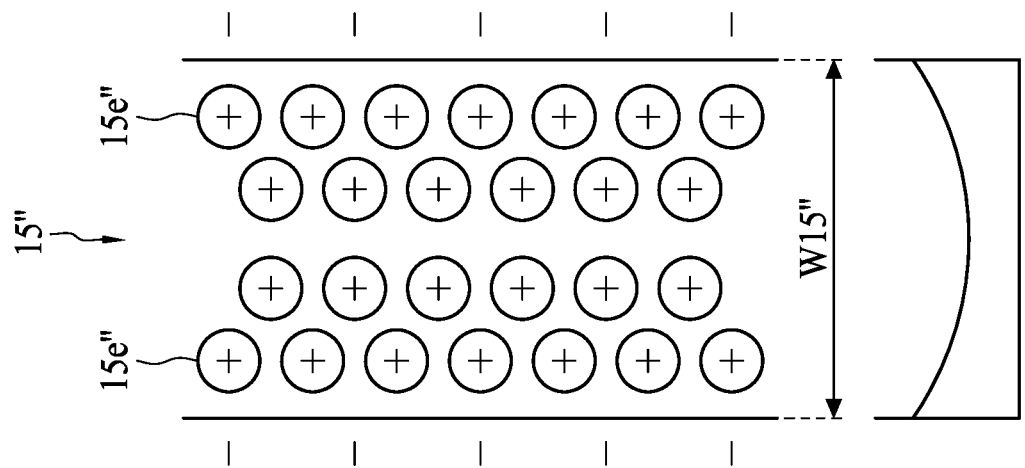
FIG. 4B is a schematic diagram showing distribution of ions in a trench and an electrical potential distribution thereof, in accordance with some embodiments of the present disclosure.
Figure 4A:
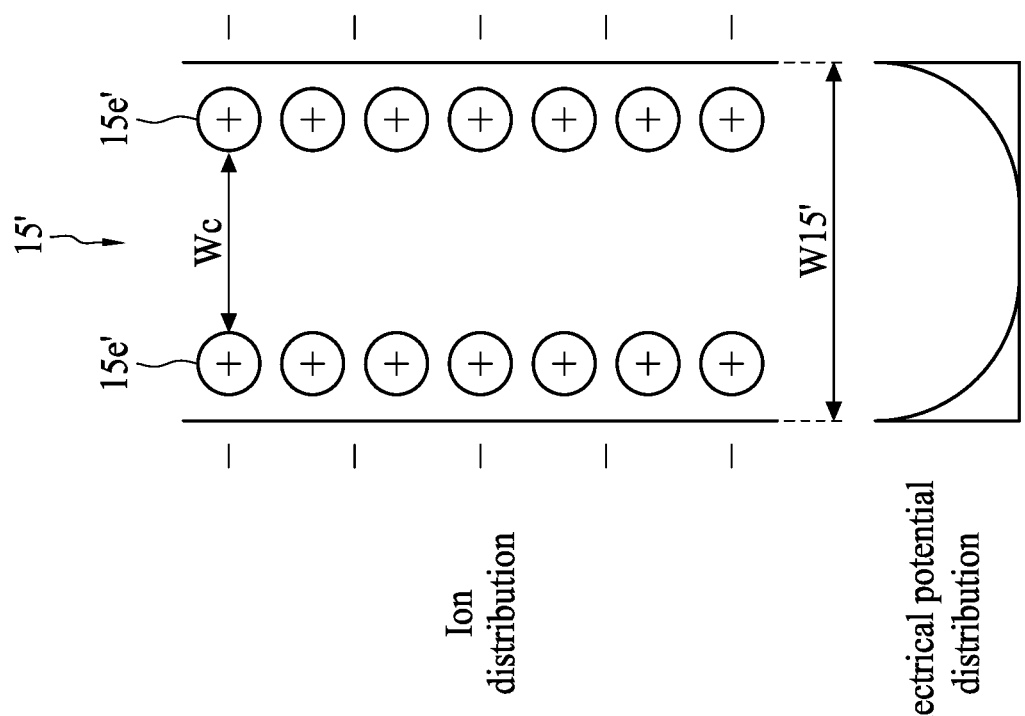
FIG. 4A is a schematic diagram showing distribution of ions in a trench and an electrical potential distribution thereof, in accordance with some embodiments of the present disclosure.

Referring to FIG. 4A and FIG. 4B, FIG. 4A is a schematic diagram showing distribution of ions in a first trench 15' and an electrical potential distribution thereof, and FIG. 4B is a schematic diagram showing distribution of ions in a second trench 15" and an electrical potential distribution thereof, in accordance with some embodiments of the present disclosure. Surface charge on a sidewall of a trench may be another possible factor which contributes to the issue of the etching solution 2 not being able to be transported to the trench bottom. Another hypothesis is that surface charge at a sidewall of a trench may induce repulsive force that hinders the etching solution 2 from transport toward the trench bottom. As illustrated in FIG. 4A and FIG. 4B, negative charges accumulate at the sidewall of the trench in proximal to trench bottom, thereby attracting positive charge centers in etching solution toward the sidewall. In some embodiments, the attracted charge centers in etching solution form an electric double layer (EDL) in the trench. EDL is a local bipolar charge induced by the surface charge, wherein Debye length is one of the values for quantifying how far the electric field effect of the EDL persists. It is noteworthy that the surface charge at trench sidewall may be positive or negative.

As shown in FIG. 4A, inasmuch as an EDL 15e' of the first trench 15' is separated by an enough distance, a center portion between the EDL 15e' may not be substantially affected by surface charge, as shown in the electrical potential distribution in FIG. 4A. The electrical potential decreases from the sidewall to zero before reaching the center portion of the trench. Thus the etching solution 2 may be able to be transported to a bottom of the first trench 15' through the EDL-free channel without being interfered by the electrical potential. A width We of EDL-free channel, which allows the etching solution 2 to infiltrate through, may be positively correlated to a width W15' of the trench 15' and negatively correlated to the Debye length of the EDL 15e'.

As shown in FIG. 4B, inasmuch as an EDL 15e" of the first trench 15' is not separated by an enough distance, in some embodiments two sides of EDL 15e" being overlapped, a center portion of the second trench 15" may be affected by surface charge, as shown in the electrical potential distribution in FIG. 4B. The electrical potential decreases from the sidewall toward the center portion of the trench but holds at positive values between opposite sidewalls. The etching solution 2 may not be able to be transferred to a bottom of the second trench 15" because there is nearly no EDL-free channel. In some embodiments, the width W15' of the first trench 15' is wider than 20 nm, and a width W15" of the second trench 15" is narrower than 20 nm. In some other embodiments, an aspect ratio of the first trench 15' is lower than 2, and an aspect ratio of the second trench 15" is greater than 2.

Simulation and experiments are performed for examining the assumption of the issue of the etching solution 2 not being able to be transported to a trench bottom of a trench stems from surface charge. Referring to FIG. 5A, FIG. 5B, and FIG. 5C, FIG. 5A is an iso-proton concentration diagram showing a simulation result of a concentration distribution of proton in the first trench 15', and FIG. 5B is an iso-proton concentration showing a simulation result of a concentration distribution of proton in the second trench 15", FIG. 5C is an iso-proton concentration diagram showing a simulation result of a concentration distribution of proton in the third trench 15''', in accordance with some embodiments of the present disclosure. An analytic simulation system, such as COMSOL Multiphysics® or other suitable systems such as Multiphysics simulator or finite element systems, can be used to simulate the electrical behavior of a liquid material being applied over a trench having an electric double layer (EDL). For example, the liquid material may be represented as proton, as a concentration distribution of proton in the first trench 15' is illustrated in FIG. 5A, a concentration distribution of proton in the second trench 15" is illustrated in FIG. 5B, and a concentration distribution of proton in the third trench 15''' is illustrated in FIG. 5C. For example, a width of the first trench 15' is about 20 nm, a width of the second trench 15'' is about 5 nm, and a width of the third trench 15''' is about 54 nm. The concentration distribution of proton is presented by the iso-proton concentration lines, or iso-[H$^+$]lines, wherein a first region 15$p$ represents an area of a concentration distribution of proton being greater than 1,500 mole/m$^3$, a second region 15$q$ represents an area of a concentration distribution of proton being in a range from about 1,000 mole/m$^3$ to about 1,500 mole/m$^3$, a third region 15$r$ represents an area of a concentration distribution of proton being in a range from about 700 mole/m$^3$ to about 1,000 mole/m$^3$, and a fourth region 15$s$ represents an area of a concentration distribution of proton being less than 700 mole/m$^3$.

It is noteworthy that the liquid material may also be represented by electron, hydroxide, cations, anions, or other suitable ions, in which similar result may be obtained. In FIG. 5A, FIG. 5B, and FIG. 5C, one can conclude that with wider trench width, the first region 15$p$, i.e., a concentration distribution of proton being greater than 1,500 mole/m$^3$, is closer to the trench bottom than the narrower trench width counterpart. It is also observed that with trench width narrower than 20 nm, the wet etch rate close to trench bottom is substantially decreased due to the inaccessibility of the protons, or in this case, the etching solution.

Figure 6:
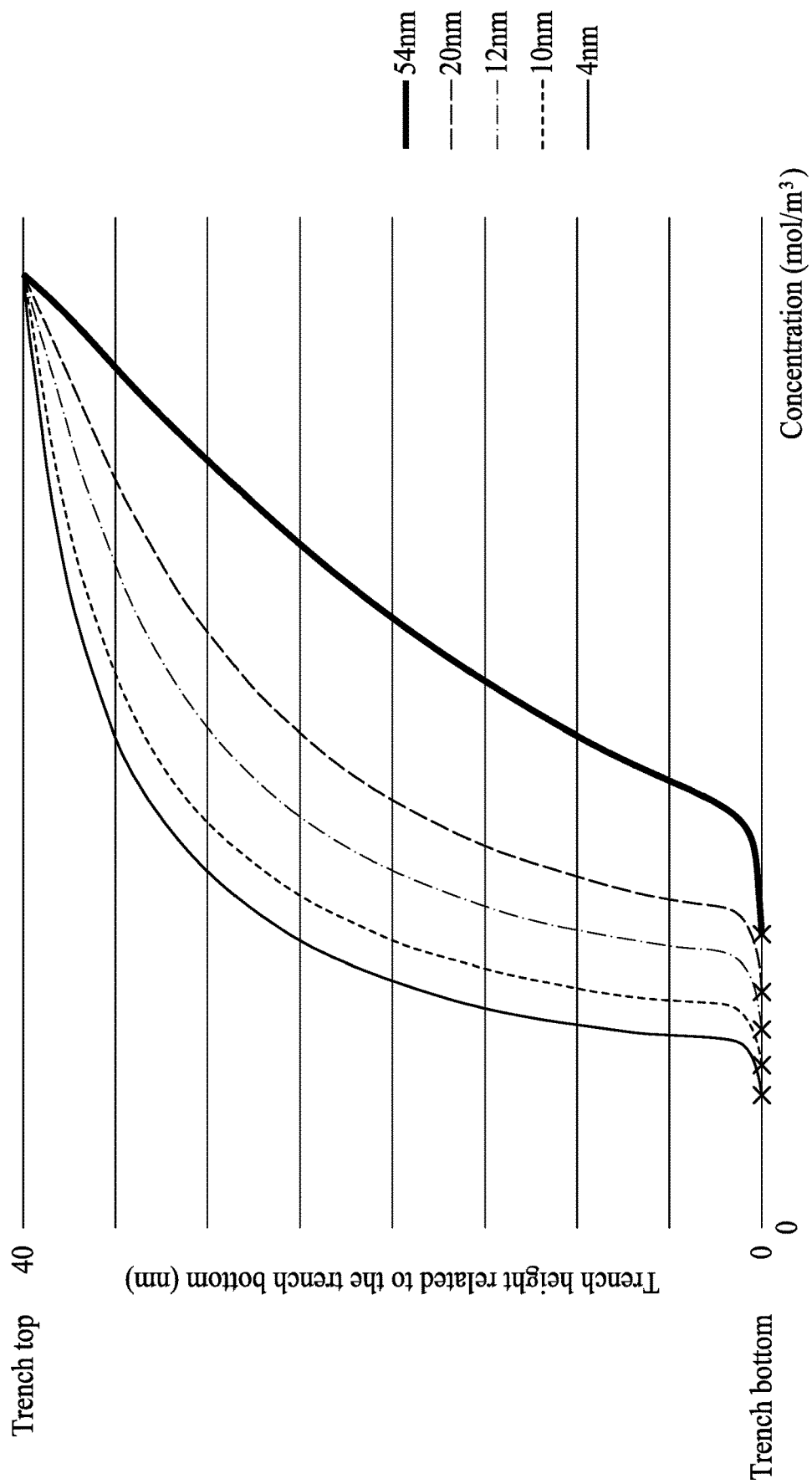
FIG. 6 is a diagram showing a relationship between trench width and a concentration distribution of proton in a trench based on simulation result, in accordance with some embodiments of the present disclosure.

Referring to FIG. 6, FIG. 6 is a diagram showing a relationship between trench width and a concentration distribution of proton in a trench based on simulation result, in accordance with some embodiments of the present disclosure. Aforementioned simulation results of trenches with various widths are performed, as concentration distribution of proton of each trench from a trench bottom to a trench top is shown in FIG. 6. An exemplary simulation result of trenches having width of 4 nm, 10 nm, 12 nm, 20 nm, 54 nm is incorporated in the diagram of FIG. 6. A concentration of proton decreases from the trench top to the trench bottom. While by comparison, a concentration of proton at trench bottom of a wider trench (e.g. 54 nm) is greater than a concentration of proton at trench bottom of a narrower trench (e.g. 4 nm). FIG. 6 shows that downward transportation of etching solution is easier to be hindered by the EDLs in a narrower trench than in a wider trench.

Figure 7:
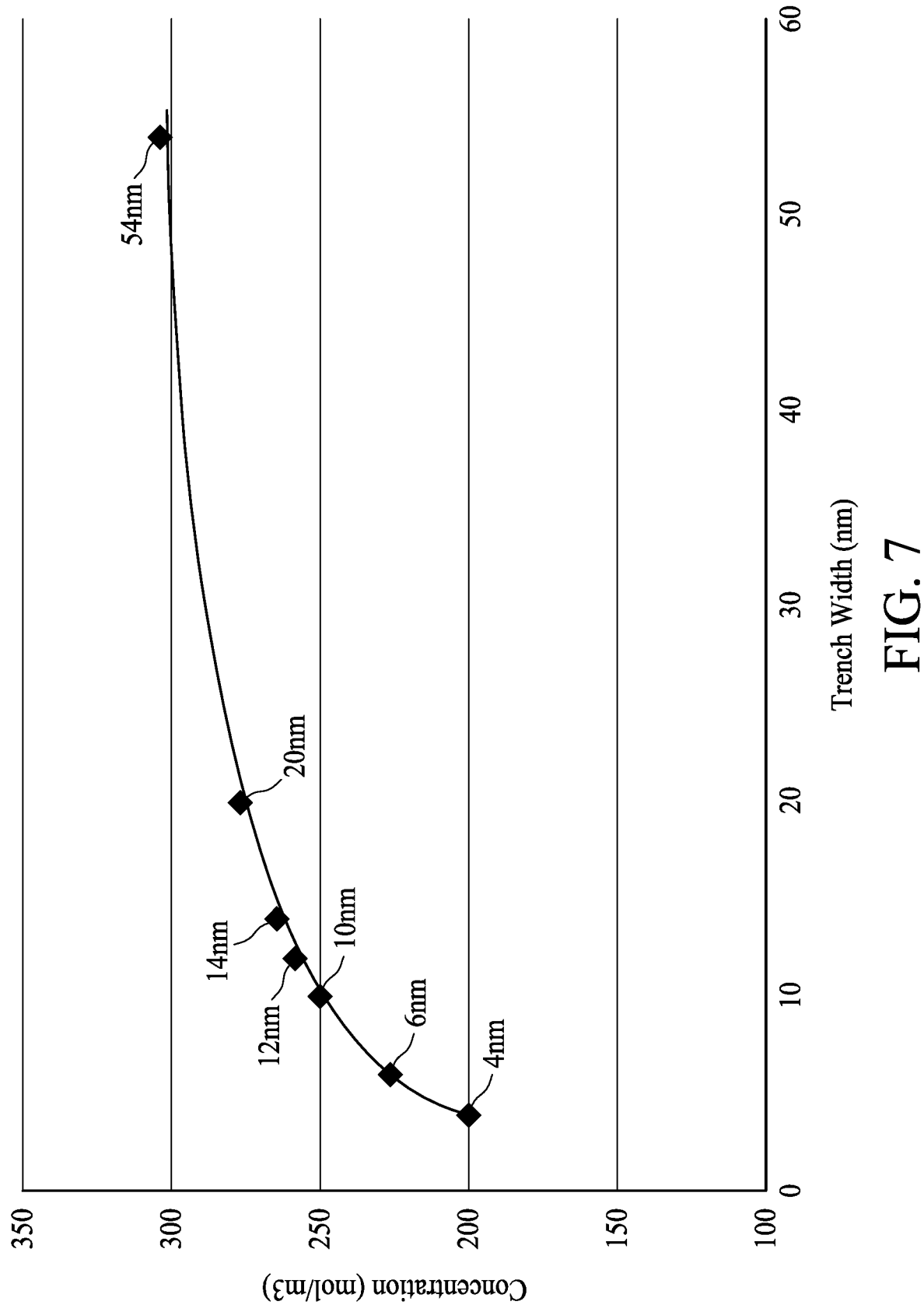
FIG. 7 is a diagram showing a relationship between trench width and a concentration of proton at a trench bottom based on simulation result, in accordance with some embodiments of the present disclosure.

Referring to FIG. 6 and FIG. 7, FIG. 7 is a diagram showing a relationship between trench width and a concentration of proton at a trench bottom based on simulation result, in accordance with some embodiments of the present disclosure. Concentration of proton at trench bottom of various widths of trench based on simulation result is obtained, which are the x-intercept of each data line shown in FIG. 6. Concentrations of proton at trench bottom of each width of trench thus can be incorporated into a diagram by pairing a concentration of proton at a trench bottom and the trench width thereof, as shown in FIG. 7. A relationship between trench width and a concentration of proton at a trench bottom can be fitted by suitable method, wherein a narrower trench with has a lower concentration of proton at a trench bottom than the wider trench counterpart. Because the proton concentration is an indication of the concentration of etching solution, lower portion concentration at the trench bottom correlates to the fact that etching solution cannot be transported to trench bottom when the trench is sufficiently narrow due to the interference of EDL.

Figure 8:
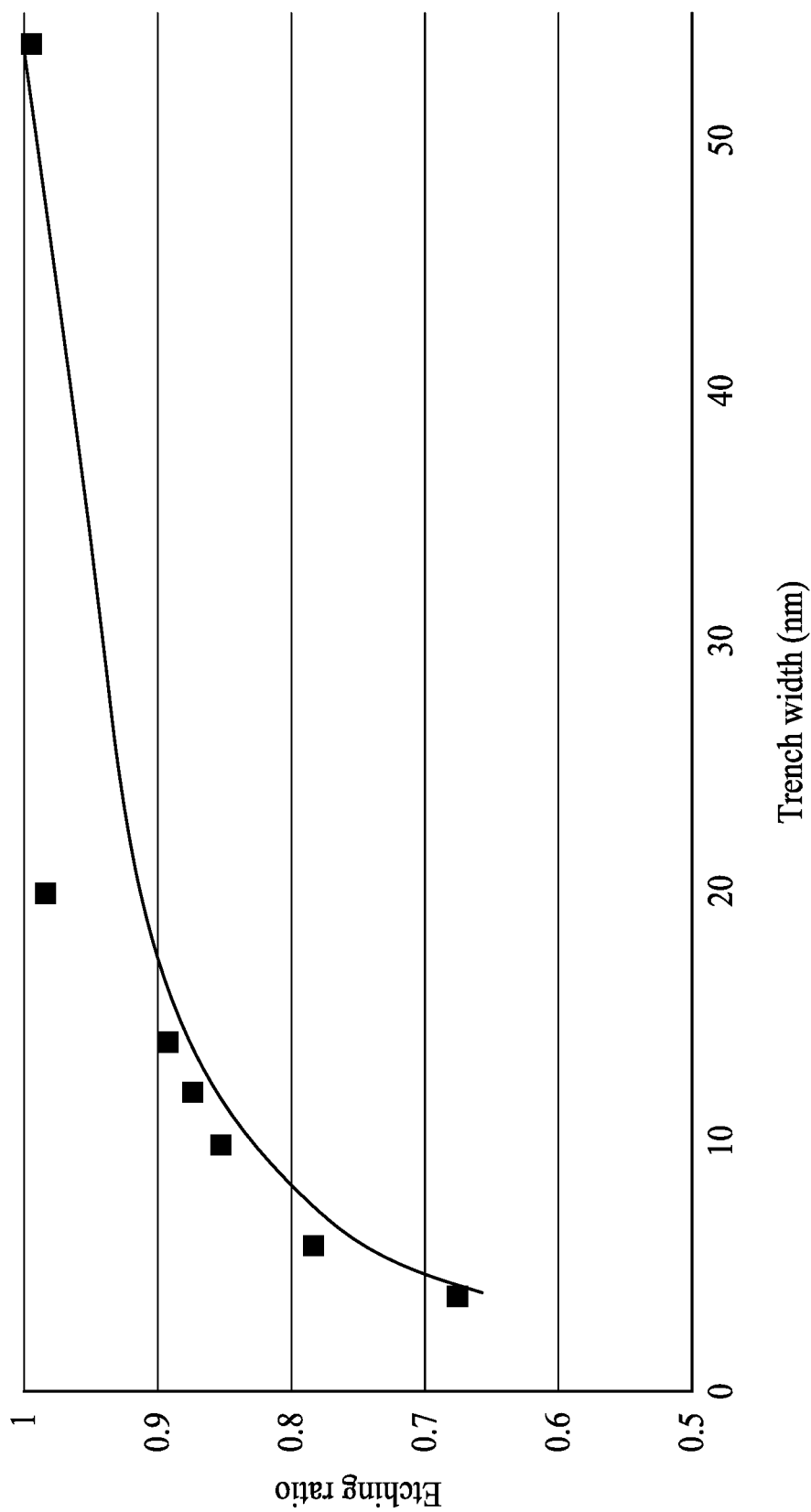
FIG. 8 is a diagram showing a relationship between trench width and etched ratio, and further includes a relationship between trench width and a concentration of proton at a trench bottom based on simulation result, in accordance with some embodiments of the present disclosure.

Referring to FIG. 7 and FIG. 8, FIG. 8 is a diagram showing a relationship between trench width and etching ratio. A wet etch control experiment is performed to be compared to the obtained simulation result previously discussed in FIG. 7. The wet etch control experiment entails a wet etch operation to form a trench, similar to the example of FIG. 1A, wherein various trenches having same height with various width are selected as comparative references. Herein an etching ratio is measured with respect to a normalized value (i.e. about 99%) resulted from a bulk trench having a width greater than 50 nm. Such etching ratio can be an indicator of whether the wet etch solution can be transported to the trench bottom. A relationship of the aforesaid etching rate of each trench under the wet etch operation and the width of the trench thereof is incorporated as the diagram shown in FIG. 8. It may be observed that the result of the wet etch control experiment is highly correlated to the simulation result presented in FIG. 7. Thus the assumption of etching solution not being able to be transported to a trench bottom of a trench stems from surface charge may be supported by the comparison of the simulation result presented in FIG. 7 and the experimental result presented in FIG. 8.

As previously discussed in FIG. 4A and FIG. 4B, Debye length is one of the values for quantifying how far the electric field effect of the EDL persists. Debye length for a monovalent electrolyte can be denoted as $\kappa^{-1}$, and expressed by the Debye length formula, $$\kappa^{-1}=[(\varepsilon_r*\varepsilon_0*k_B*T)/(2*N_A*I*e^2)]^{0.5},$$

among which I is the ionic strength of the electrolyte, $\varepsilon_0$ is the vacuum permittivity, $\varepsilon_r$ is the relative permittivity or dielectric constant, $k_B$ is the Boltzmann constant, T is the absolute temperature (K), $N_A$ is the Avogadro number, and e is the elementary charge.

In order to lower the electrostatic effect of surface charge, or alternatively stated, reduce the Debye length of the EDL, a material of the etching solution (such as etching solution 2 shown in FIG. 1A) can be adjusted according to the Debye length formula.

In some embodiments, Debye length can be reduced by increasing the ionic strength of the electrolyte (I) of the etching solution, wherein the etching solution may be prepared by adding an ionic strength enhancer. In some embodiments, the ionic strength enhancer may include cations (such as Li$^+$, Na$^+$, K$^+$, Mg$^{2+}$, Ca$^{2+}$, NH$_4^+$, N(CH$_3$)$^+$, N(C$_2$H$_5$)$_4^{++}$, or the like) and/or anions (such as F$^-$, Cl$^-$, Br$^-$, I$^-$, SO$_4^{2-}$, CO$_3^{2-}$, HCO$_3^-$, or the like). In some embodiments, the ionic strength enhancer may include Ammonium chloride (NH$_4$Cl), tetramethylammonium chloride, ammonium carbonate, or the like. In some embodiments, the ionic strength enhancer may not considerably alter the pH value of the etching solution.

In some embodiments, the ionic strength enhancer may be further added into conventional etching solution, including, but not limited to, tetramethylammonium Hydroxide (TMAH), hydrochloric acid (HCl), ammonium hydroxide (NH$_4$OH), ammonium solution, or other suitable solution. In some embodiments, the etchant may include identical cations with the ionic strength enhancer. In some embodiments, the etchant may include hydrochloric acid (HCl), tetramethylammonium hydroxide, ammonia, or the like.

Figure 9:
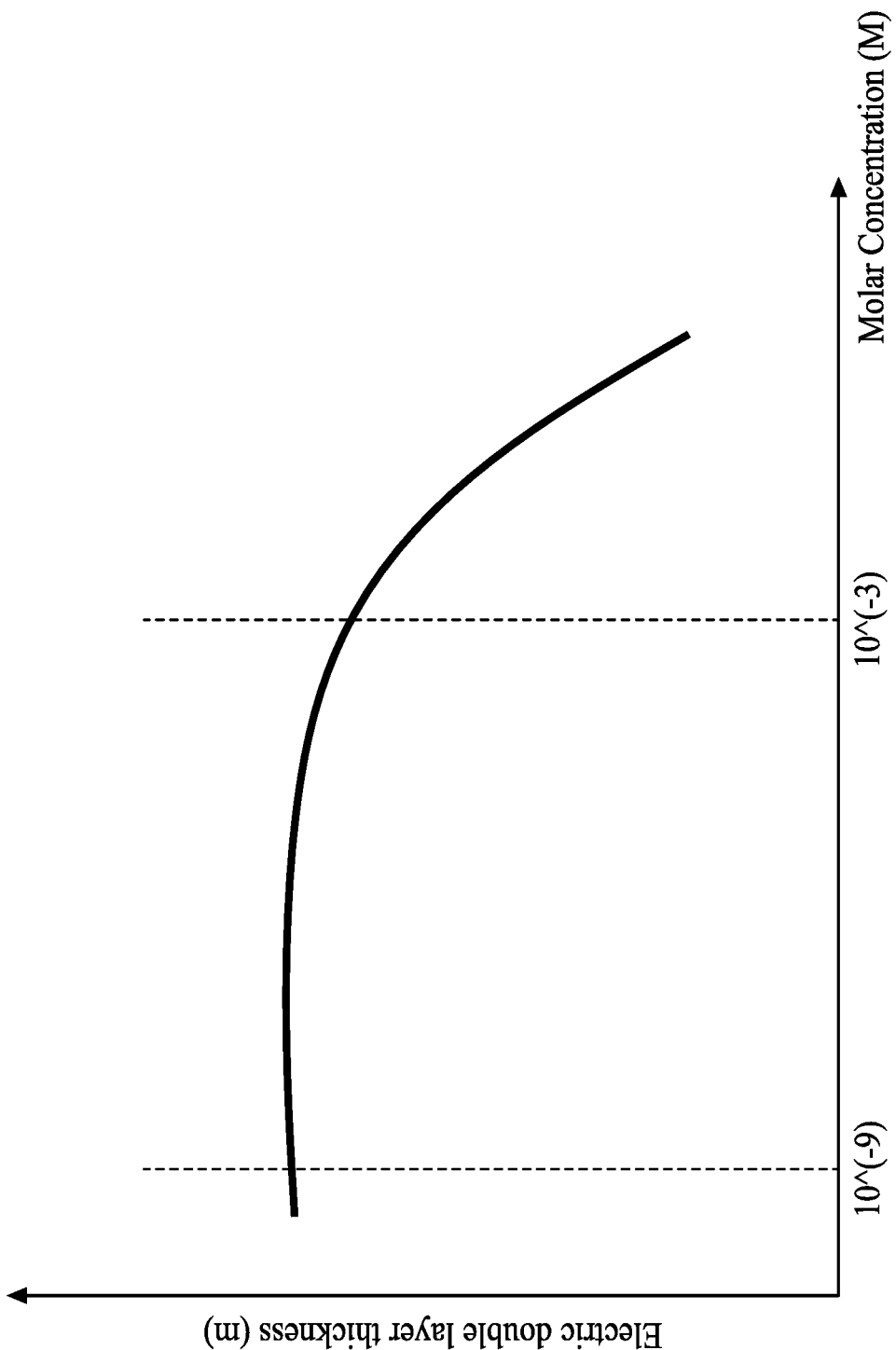
FIG. 9 is a diagram showing a relationship between a molar concentration of an ionic strength enhancer in an etchant and a thickness of an electric double layer formed in a trench, in accordance with some embodiments of the present disclosure.

Referring to FIG. 9, FIG. 9 is a diagram showing a relationship between a molar concentration of an ionic strength enhancer in etching solution and a thickness of an EDL formed in a trench, in accordance with some embodiments of the present disclosure. When the ionic strength enhancer having an ionic strength greater than 10$^{-3}$ M in the etching solution, the thickness of the EDL may be substantially decrease, thereby allowing the EDL-free channel to be formed in the nanoscale trench.

Referring back to the Debye length formula, the dielectric constant $\varepsilon_r$ is positively correlated to the Debye length, therefore the Debye length can be lowered by decreasing the dielectric constant of the solvent. In some embodiments, the dielectric constant of the etching solution may be substantially lowered if the dielectric constant of the solvent added thereto is lower than the dielectric constant of water, or further lower than about 30. In some embodiments, solvent with lower dielectric constant may include isopropanol (IPA, having a dielectric constant about 17.9), super critical carbon dioxide ($scCO_2$, having a dielectric constant about 1.5), acetone ($C_3H_6O$, having a dielectric constant about 20.7), acetic acid ($C_2H_4O_2$, having a dielectric constant about 6.15), ethyl acetate ($C_4H_8O_2$, having a dielectric constant about 6.02), or the like. In some embodiments, acetic acid may be used for acidic formulation. In some embodiments, acetone and isopropanol may be used for acidic, basic, and neutral formation. In some embodiments, ethyl acetate can be used for acidic or neutral formation.

Also referring to the Debye length formula, the absolute temperature of the etching solution is correlated to the Debye length. However, it is noteworthy that the dielectric constant of the etching solution is negatively correlated to the temperature, wherein when the absolute temperature of the etching solution increase by a given ratio, the dielectric constant of the etching solution decreases more than such given ratio. Alternatively stated, product of dielectric constant $\varepsilon_r$ and temperature T in the Debye length formula may decrease when the temperature of the etching solution is increased. Therefore, in order to decrease the Debye length, the temperature of the etching solution is heated to a predetermined temperature of at least 30° C. (303K) prior to applying the etching solution to a semiconductor nanoscale trench in order to reach a desired Debye length.

Figure 10A:
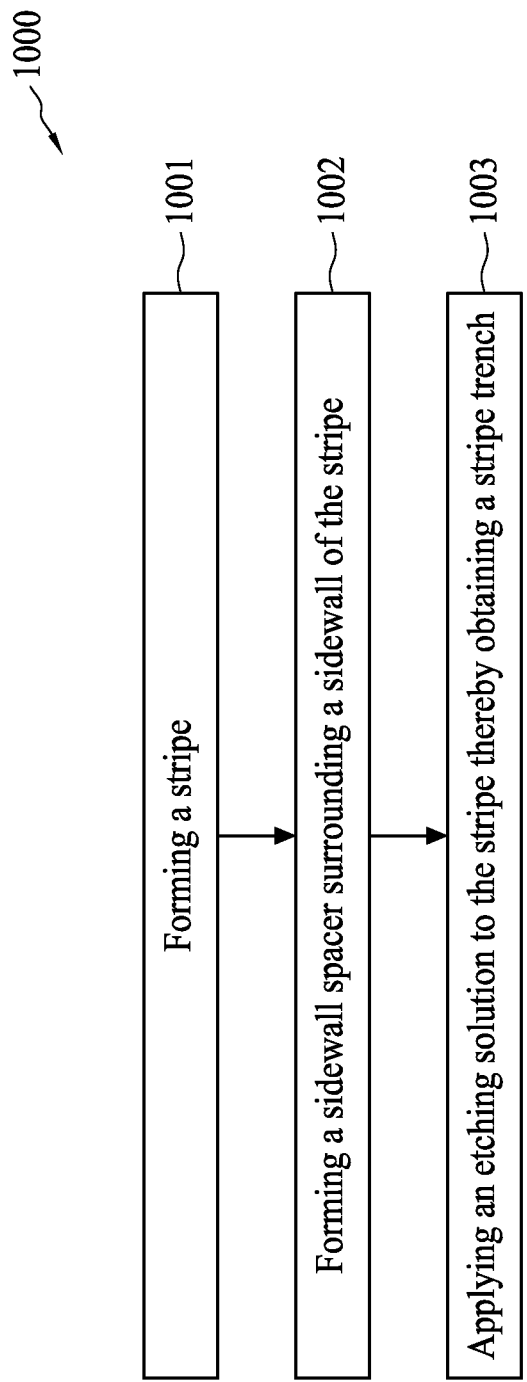
FIG. 10A shows a flow chart representing a method of removing a stripe having a line width smaller than 20 nm in a semiconductor structure, in accordance with some embodiments of the present disclosure.

Referring to FIG. 10A, FIG. 10A shows a flow chart representing method of removing a stripe having a line width smaller than 20 nm in a semiconductor structure, in accordance with some embodiments of the present disclosure. The operation of removing a stripe having a line width smaller than 20 nm in a semiconductor structure may include forming a stripe (operation 1001), forming a sidewall spacer surrounding a sidewall of the stripe (operation 1002), and applying an etching solution to the stripe thereby obtaining a stripe trench (operation 1003).

Figure 10C:
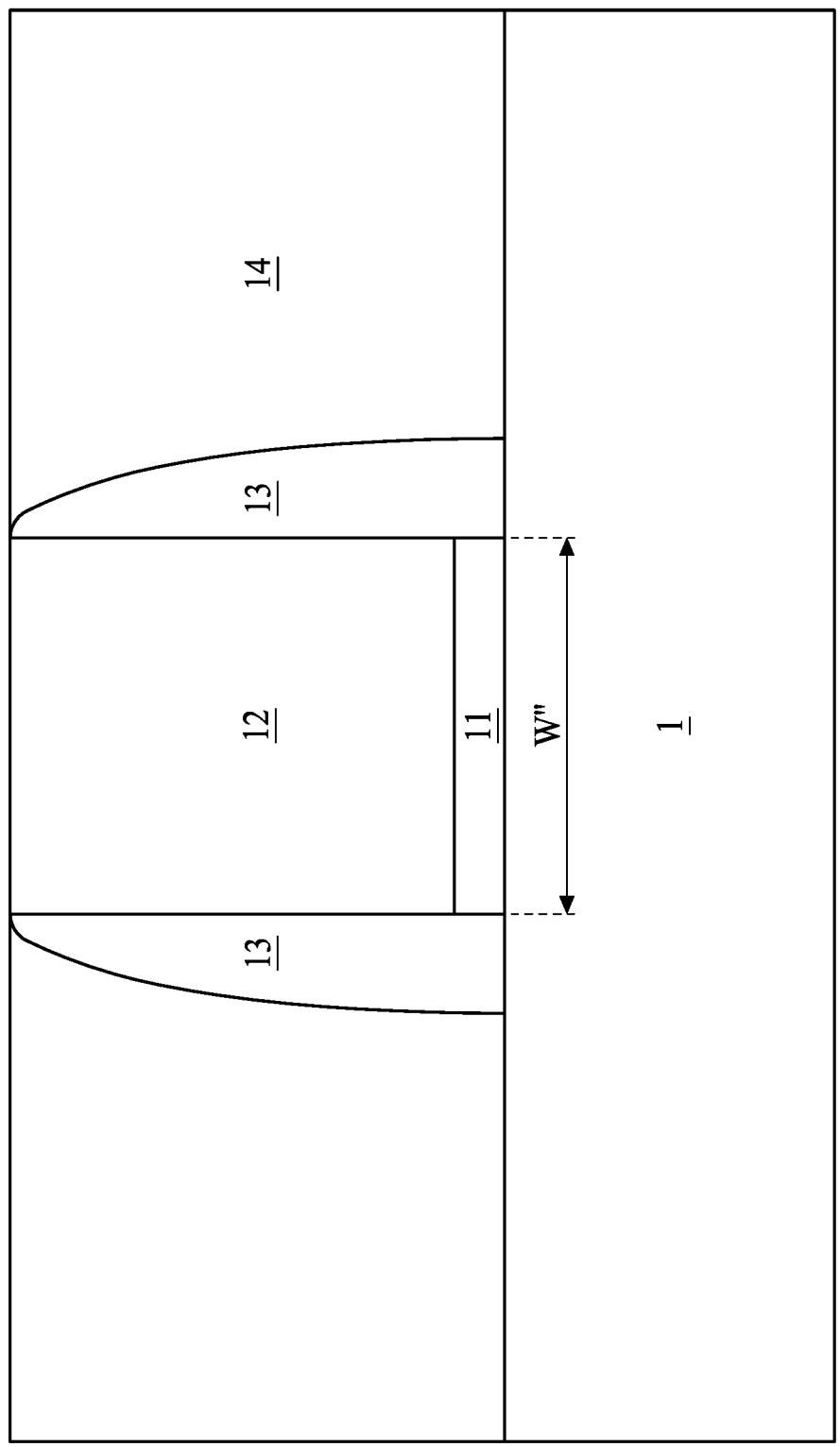

Referring to FIG. 10B and FIG. 10C, FIG. 10B and FIG. 10C are cross sections of a semiconductor structure during intermediate stages of manufacturing operations, in accordance with some embodiments of the present disclosure. A stripe 12 having an average line width W'' is formed on a substrate 1, wherein the average line width W'' may be less than 20 nm. In some embodiments, a height-to-width ratio of the stripe may be greater than 2. A liner 11 may be optionally formed between the stripe 12 and the substrate 1. In some embodiments, the stripe 12 may include silicon epitaxy, or polysilicon. In some embodiments, other suitable materials for forming a sacrificial gate or a dummy gate are also within the scope of stripe formation. Forming the stripe 12 may entail operations such as forming a silicon epitaxy layer or a polysilicon layer and patterning such layer to form a plurality of stripes. A sidewall spacer 13 is subsequently formed to surround a sidewall of the stripe 12, and a dielectric layer 14 is optionally formed to surround the sidewall spacer 13.

Referring to FIG. 10C, FIG. 10C is a cross section of a semiconductor structure during intermediate stages of manufacturing operations, in accordance with some embodiments of the present disclosure. A wet etch operation is performed. The aforementioned etching solution, which may include an etchant, an ionic strength having an ionic strength enhancer greater than $10^{-3}$ M (mole/m$^3$) in the etching solution, and/or a solvent having a dielectric constant lower than water, are utilized in the wet etch operation. In some embodiments, the etching solution 2 may further be heated to a predetermined temperature prior to applying to the semiconductor structure. As previously discussed, adjusting the temperature of the etching solution 2 effectively reduce the Debye length of the EDL by lowering the product of dielectric constant and temperature of the etching solution 2. The etching solution 2 is subsequently applied on the semiconductor structure for removing the stripe 12.

In some embodiments, the etching solution 2 may include ammonia solution ($NH_4OH$, 0.1% to 29% concentration) as the etchant and Ammonium chloride ($NH_4Cl$), having a molar concentration in a range from about $10^{-3}$ M to about 10 M, as the ionic strength enhancer. The etching solution may be heated to at least 30° C.

In some embodiments, the etching solution 2 may include 50%-90% weight percent of Tetramethylammonium Hydroxide (e.g., diluted from 2.38% TMAH) as the etchant and 10%-50% weight percent of isopropanol (IPA) as solvent for reducing dielectric constant. The etching solution may be heated to at least 30° C.

In some embodiments, the etching solution 2 may be a mixture of any etchant, ionic strength enhancer, and solvent described above.

Figure 10D:
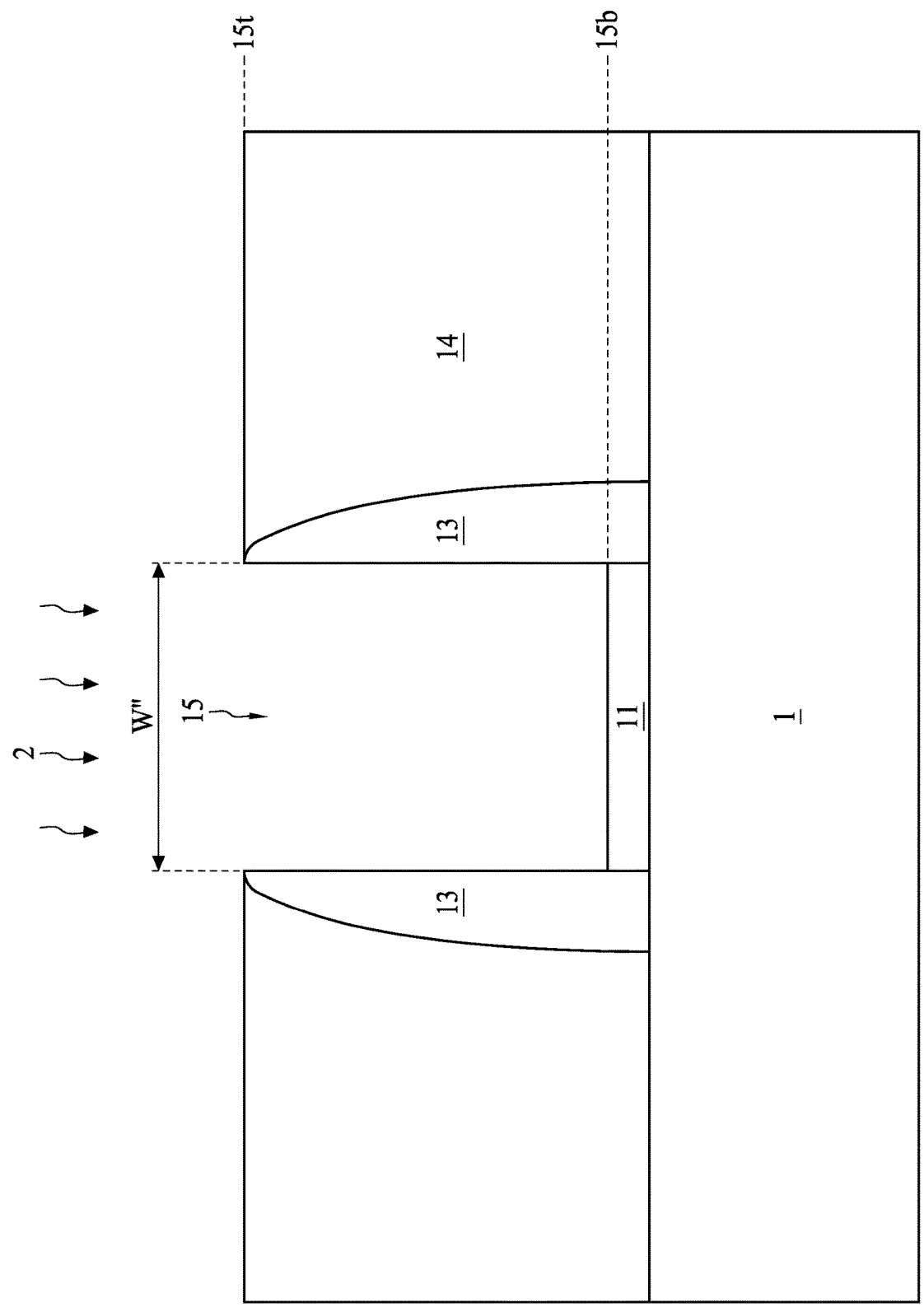

Referring to FIG. 10D, FIG. 10D is a cross section of a semiconductor structure during intermediate stages of manufacturing operations, in accordance with some embodiments of the present disclosure. Subsequent to applying the etching solution 2 to the stripe top 15$t$, the etching solution 2 may be further transported to the trench bottom 15$b$ of the stripe trench 15, and a stripe trench 15 between the sidewall spacer 13 is thereby formed with an average trench width close to the stripe width W''. A width of the stripe trench 15 may be less than 20 nm, or an aspect ratio of the stripe trench 15 may be greater than 2.

The present disclosure provides a semiconductor structure etching solution, method of transporting an etchant to a bottom of a semiconductor trench having an opening smaller than 20 nm, and method of removing a stripe having a line width smaller than 20 nm in a semiconductor structure. In order to transport an etchant to a bottom of a semiconductor trench having an opening smaller than 20 nm and alleviate the narrowing of ionic transportation channel caused by EDL, the present disclosure provides etching solution with ionic strength enhancer having as ionic strength greater than $10^{-3}$ M in the etching solution, which contains cations and anions such as $Li^+$, $Na^+$, $K^+$, $Mg^{2+}$, $Ca^{2+}$, $NH^{4+}$, $N(CH_3)^+$, $N(C_2H_5)^{4+}$, $F^-$, $Cl^-$, $Br^-$, $I^-$, $SO_4^{2-}$, $CO_3^{2-}$, $HCO_3^-$, Ammonium chloride ($NH_4Cl$), tetramethylammonium chloride ($N(CH_3)_4Cl$), ammonium carbonate (($NH_4)_2CO_3$). The etching solution may also include suitable etchant such as hydrochloric acid (HCl), tetramethylammonium hydroxide (TMAH), ammonia ($NH_4OH$), and suitable solvent such as acetic acid, acetone, isopropanol (IPA), ethyl acetate, super critical carbon dioxide ($scCO_2$), and the like. In some embodiments, the etching solution may further be heated to at least 30° C.

The etching solution may be utilized in various etching operations, such as stripe removal, sacrificial gate removal, metal gate removal, film etching, lateral etching, trench fabrication, FinFET fabrication, DRAM fabrication, selective removal operation, nanowire fabrication, nano-sheet fabrication, or the like.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

Some embodiments of the present disclosure provide a semiconductor structure etching solution, including an etchant, an ionic strength enhancer having an ionic strength greater than $10^{-3}$ M in the semiconductor structure etching solution, and a solvent having a dielectric constant lower than a dielectric constant of water.

Some embodiments of the present disclosure provide a method of transporting an etchant to a bottom of a semiconductor trench having an opening smaller than 20 nm, including applying an ionic strength enhancer with the etchant to the semiconductor trench.

Some embodiments of the present disclosure provide a method of method of removing a stripe having a line width smaller than 20 nm in a semiconductor structure, including forming a stripe, forming a sidewall spacer surrounding a sidewall of the stripe, and applying an etching solution to the stripe thereby obtaining a stripe trench, wherein the etching solution includes an ionic strength enhancer having an ionic strength greater than $10^{-3}$ M in the etching solution, a solvent, and an etchant.

What is claimed is:

1. A method of transporting an etchant to a bottom of a semiconductor trench having an opening smaller than 20 nm, the method comprising:
applying an ionic strength enhancer with the etchant to the semiconductor trench, wherein the ionic strength of the ionic strength enhancer is greater than $10^{-3}$ M in the etchant, the etchant comprising tetramethylammonium hydroxide.

2. The method of claim 1, wherein the trench has a height-to-width ratio greater than 2.

3. The method of claim 1, further comprising applying a solvent with a dielectric constant lower than that of water with the etchant and the ionic strength enhancer to the semiconductor trench.

4. The method of claim 3, further comprising heating the solvent to over 30° C. prior to applying to the semiconductor trench.

5. The method of claim 1, wherein the ionic strength enhancer comprises $NH_4Cl$.

6. The method of claim 1, wherein the ionic strength enhancer comprises tetramethylammonium chloride.

7. The method of claim 1, wherein the ionic strength enhancer comprises $Li^+$, $Na^+$, $K^+$, $Mg^{2+}$, $Ca^{2+}$, $NH^{4+}$, $N(CH_3)^+$, or $N(C_2H_5)^{4+}$.

8. A method of removing a stripe having a line width smaller than 20 nm in a semiconductor structure, the method comprising:
forming a stripe;
forming a sidewall spacer surrounding a sidewall of the stripe; and
applying an etching solution to the stripe thereby obtaining a stripe trench,
wherein the etching solution comprises:
an ionic strength enhancer having an ionic strength greater than $10^{-3}$ M in the etching solution, wherein the ionic strength enhancer comprises $Li^+$, $Na^+$, $K^+$, $Mg^{2+}$, $Ca^{2+}$ $N(CH_3)^+$, or $N(C_2H_5)^{4+}$;
a solvent; and
an etchant.

9. The method of claim 8, wherein an aspect ratio of the stripe trench is greater than 2.

10. The method of claim 8, wherein forming the stripe comprises;
forming a silicon epitaxy layer; and
patterning the silicon epitaxy layer to form a plurality of stripes.

11. The method of claim 8, wherein the etchant comprises ammonia.

12. The method of claim 8, wherein the etchant comprises tetramethylammonium hydroxide and the solvent comprises isopropanol.

13. The method of claim 8, wherein the solvent comprises isopropanol, acetone, acetic acid, ethyl acetate, or super critical carbon dioxide.

14. A method for silicon removal enhancement during forming a semiconductor structure, comprising:
combining an ionic strength enhancer, a solvent and an etchant to form an etching solution, wherein the ionic strength enhancer has an ionic strength greater than $10^{-3}$ M in the etching solution, the solvent comprising at least one of isopropanol, acetone, acetic acid, ethyl acetate, or super critical carbon dioxide;
forming a semiconductor structure, comprising:
forming a first material layer, wherein the first material layer comprises silicon; and
forming a second material layer adjacent to a sidewall of the first material layer; and
removing the first material by applying the etching solution over the semiconductor structure to expose a sidewall of the second material layer.

15. The method of claim 14, wherein the etchant comprises HCl, tetramethylammonium hydroxide, or ammonia.

16. The method of claim 14, wherein the ionic strength enhancer and the etchant comprises identical cations.

17. The method of claim 14, wherein the ionic strength enhancer comprises $Li^+$, $Na^+$, $K^+$, $Mg^{2+}$, $Ca^{2+}$, $NH^{4+}$, $N(CH_3)^+$, or $N(C_2H_5)^{4+}$.

18. The method of claim 14, wherein the ionic strength enhancer comprises $F^-$, $Cl^-$, $Br^-$, $I^-$, $SO_4^{2-}$, $CO_3^{2-}$, or $HCO_3^-$.

19. The method of claim 14, wherein the ionic strength enhancer comprises $NH_4Cl$, ammonium carbonate, or tetramethylammonium chloride.

20. The method of claim 14, wherein the dielectric constant of the solvent is lower than 30.

\* \* \* \* \*